(12) United States Patent
Wu et al.

(10) Patent No.: US 6,591,128 B1
(45) Date of Patent: Jul. 8, 2003

(54) MRI RF COIL SYSTEMS HAVING DETACHABLE, RELOCATABLE, AND OR INTERCHANGEABLE SECTIONS AND MRI IMAGING SYSTEMS AND METHODS EMPLOYING THE SAME

(75) Inventors: Dee H. Wu, Shaker Heights, OH (US); Michael Burl, Chagrin Falls, OH (US); Laura M. Reden, Lyndhurst, OH (US); John T. Carlon, Madison, OH (US)

(73) Assignee: Koninklijke Philips Electronics, N.V., Eindhoven (NL)

( * ) Notice: Subject to any disclaimer, the term of this patent is extended or adjusted under 35 U.S.C. 154(b) by 223 days.

(21) Appl. No.: 09/710,376

(22) Filed: Nov. 9, 2000

(51) Int. Cl.$^7$ .................................................. A61B 5/05
(52) U.S. Cl. ...................................... 600/422; 324/318
(58) Field of Search .................................... 600/422, 423, 600/421; 324/318, 309, 322, 300, 306, 307, 304

(56) References Cited

U.S. PATENT DOCUMENTS

| | | | |
|---|---|---|---|
| 4,825,162 A | 4/1989 | Roemer et al. ............. | 324/318 |
| 5,361,765 A | 11/1994 | Herlihy et al. ........... | 128/653.5 |
| 5,517,120 A | 5/1996 | Misic et al. ................ | 324/318 |
| 5,594,337 A | 1/1997 | Boskamp .................... | 324/318 |
| 5,602,479 A | 2/1997 | Srinivasan et al. ......... | 324/318 |
| 5,898,306 A | 4/1999 | Liu et al. .................... | 324/322 |
| 5,905,378 A | 5/1999 | Giaquinto et al. .......... | 324/318 |
| 6,029,082 A | 2/2000 | Srinivasan et al. ......... | 600/422 |
| 6,177,797 B1 * | 1/2001 | Srinivasan .................. | 324/318 |
| 6,316,941 B1 * | 11/2001 | Fujita et al. ................. | 324/318 |
| 6,441,612 B1 * | 8/2002 | Shimo et al. ................ | 324/309 |
| 6,441,615 B1 * | 8/2002 | Fujita et al. ................. | 324/318 |

FOREIGN PATENT DOCUMENTS

| | | |
|---|---|---|
| JP | 06254068 | 9/1994 |
| JP | 11299754 | 11/1999 |

OTHER PUBLICATIONS

"Functional Brain Imaging", Orrison, et al., 1995, New York: Moseby. 477.
"Functional Mapping of the Human Visual Cortex at 4 and 1.5 Tesla Using Deoxygenation Contrast EPI", Turner, et al. Magn. Reson. Med, 1993 29(2) : p. 277–9.
"An Efficient, Highly Homogeneous Radiofrequency Coil For Whole–Body NMR Imaging at 1.5T", Hayes, et al., J. Magn. Reson. Med., 1985 63: p. 622–688.
"The Theory of the Bird–Cage Resonator", Tropp, J. Magn. Reson., 1989 82: p. 51–62.
"A Phased Array Echoplanar Imaging System For fMRI", Frederick, et al., Magn. Reson. Imaging, 1998 (0730–725X TA—Magn. Reson. Imaging PG –121–9SB –M).
"The NMR Phased Array", Roemer, et al. 1990 (0740–3194 TA—Magn. Reson. Med. PG—192–225 SB –M).
"Evaluation of a "True"Dome Quadrature Head Coil", Srinivasan, et al. Proc. SMR, 3rd Annual Meeting, 1995.

* cited by examiner

Primary Examiner—Quang T. Van
(74) Attorney, Agent, or Firm—Fay, Sharpe, Fagan, Minnich & McKee, LLP (57) ABSTRACT

An RF coil construction (40, 40') includes removable, relocatable, and/or detachable sections (42, 44) that are inherently decoupled. The sections can be relocated, removed, or exchanged with sections having different coil sizes or coil configurations, allowing the coil configuration to be tailored to a desired imaging procedure and region of the brain. The coil construction provides space for stimulation devices and adjusting patient access and comfort. Since the operator can select coil removal or placement to reduce the amount of data outside the region of interest, the coil construction can also reduce scanning and reconstruction time, reduce artifacts, and provide increased temporal resolution and image throughput.

35 Claims, 10 Drawing Sheets

MRI RF COIL SYSTEMS HAVING DETACHABLE, RELOCATABLE, AND OR INTERCHANGEABLE SECTIONS AND MRI IMAGING SYSTEMS AND METHODS EMPLOYING THE SAME

BACKGROUND OF THE INVENTION

The present invention relates generally to the art of magnetic resonance. It finds particular application to magnetic resonance imaging receiver coil systems having detachable, relocatable, and/or interchangeable sections. It will be appreciated, however, that the present invention is also applicable to the examination of other portions of the human anatomy and to the imaging or spectroscopic examination of non-human subjects or other objects, materials, and so forth.

Conventionally, magnetic resonance imaging systems generate a strong, uniform, static magnetic field in a free space between poles or in a bore of a magnet. This main magnetic field polarizes the nuclear spin system of an object to be imaged placed therein. The polarized object then possesses a macroscopic magnetic moment vector pointing in the direction of the main magnetic field. In a superconducting main annular or bore magnet assembly, the static magnetic field $B_0$ is generated along a longitudinal or z-axis of the cylindrical bore.

To generate a magnetic resonance signal, the polarized spin system is excited by applying a magnetic resonance signal or radio frequency field $B_1$ perpendicular to the z-axis. The frequency of the magnetic resonance signal is proportional to the gyromagnetic ratio γ of the dipole(s) of interest. The radio frequency coil is commonly tuned to the magnetic resonance frequency of the selected dipole of interest, e.g., 64 MHZ for hydrogen dipoles $^1H$ in a 1.5 Tesla magnetic field.

Typically, a radio frequency coil for generating the magnetic resonance signal is mounted inside the bore surrounding the sample or patient/subject to be imaged. In a transmission mode, the radio frequency coil is pulsed to tip the magnetization of the polarized sample away from the z-axis. As the magnetization precesses around the z-axis back toward alignment, the precessing magnetic moment generates a magnetic resonance signal which is received by the radio frequency coil in a reception mode.

For imaging, a magnetic field gradient coil is pulsed for spatially encoding the magnetization of the sample. Typically, the gradient magnetic field pulses include gradient pulses pointing in the z-direction but changing in magnitude linearly in the x, y, and z-directions, generally denoted $G_x$, $G_y$, and $G_z$, respectively. The gradient magnetic fields are typically produced by a gradient coil which is located inside the bore of the magnet and outside of the radio frequency coil.

Conventionally, when imaging the torso, a whole body radio frequency coil is used in both transmit and receive modes. By distinction, when imaging the head, neck, shoulders, or an extremity, the whole body coil is often used in the transmission mode to generate the uniform excitation field $B_1$ and a local coil is used in the receive mode. Placing the local coil surrounding or close to the imaged region improves the signal-to-noise ratio and the resolution. In some procedures, local coils are used for both transmission and reception. One drawback to local coils it that they tend to be relatively small and claustrophobic.

One type of local frequency coil is known as the "birdcage" coil. See, for example, U.S. Pat. No. 4,692,705 to Hayes. Typically, a birdcage coil is cylindrical and comprises a pair of circular end rings which are bridged by a plurality of equi-spaced straight segments or legs. Birdcage head coils are capable of providing a high signal-to-noise ratio (SNR) and achieving readily homogeneous images. Birdcage coils are widely used for functional MRI (fMRI) and other applications.

Birdcage coils, however, are not without their disadvantages. Since, generally, the SNR and thus image quality increases with decreasing distance between the receiver coil and the volume being imaged, birdcage coils are generally designed so that they will be located very close to the subject's head, particularly since fMRI applications require the ability to extract small signals (e.g., reported to be as low as about 2–5% at 1.5 T). As the name implies, birdcage coils are also closed or cage-like in nature and thus restrict access to the subject's face and head. This results in a lack of space for placement of stimulation devices that would be desirable for fMRI experiments. Stimulation devices are devices constructed to stimulate a specific neural function of a subject, the response to which is sought to be observed through imaging the appropriate region of the brain. Such stimulators may emit, for example, mechanical, electrical, thermal, sound, or light signals designed to stimulate the neural activity of interest. The neural activity is induced by sensory stimuli, such as visual, auditory, or olfactory stimuli, taste, tactile discrimination, pain and temperature stimuli, proprioceptive stimuli, and so forth. Since the birdcage design is close fitting and not particularly open in nature, many such stimulation experiments must be performed in a manner that is suboptimal, if at all. For example, the use of a birdcage coil might preclude, due to space constraints, the use of an auditory stimulation device, such as a headphone set. Likewise, since bars are placed over the face, and in some instances directly over the eyes, birdcage coils are particularly disadvantageous for eye-tracking experiments or other visualization experiments.

Another problem with birdcage coils is that the design limits access to the patient, e.g., for therapeutic, physiological monitoring, and patient comfort purposes. Access may be needed, for example, to monitor physiological functions, such as oxygen levels, or to perform interventional medicine or use life-support devices, such as ventilator tubes, tracheotomy tubes, etc., while imaging a patient. Drug delivery, contrast agent delivery, and delivery of gases such as anesthetizing gases, contrast-enhancing gases, and the like, also require patient access. Also, it is also often desirable to enhance patient comfort through the use of patient comfort devices. However, the proximity of the axial segments to one another and to the head of the patient impairs such practices.

Yet another problem with birdcage head coils is their claustrophobic effect on patients. Many pediatric and adult patients already experience claustrophobic reactions when placed inside the horizontal bore of a superconducting magnet. Placement of a close-fitting head coil having anterior legs which obstruct the direct view of the patients further adds to their discomfort. Attempts to reduce the discomfort have been made, for example, through the use of illumination inside the magnet bore, air flow, and the use of reflective mirrors. Although claustrophobic reactions and discomfort are sometimes reduced somewhat by such measures, claustrophobia can still be problematic.

Birdcage coils are circularly polarized. Removing or altering the spacing of the legs adjacent the face alters the symmetry and can degrade performance.

Other types of localized coils include a phased array of smaller surface coils. In this manner, a greater SNR (that increases in proportion to the number of elements) than birdcage design can be achieved. For fMRI applications, flexible coil arrays can be wrapped around the head. However, these so-called flex-wrap designs are lacking in the spatial openness necessary for stimulation studies, interventional imaging, and the accommodation of therapy devices. Furthermore, it is difficult to achieve uniform placement of coils, both as between different subjects and for repeat studies of the same subject.

The present invention provides a new and improved localized RF coil that overcomes the above-referenced problems and others.

SUMMARY OF THE INVENTION

In one aspect, the present invention provides an radio frequency (RF) coil system for magnetic resonance imaging of one or more regions of a subject. The coil system includes a first coil section comprising one or more conductive coils in a first nonconductive housing, and a second coil section comprising one or more conductive coils in a second nonconductive housing, wherein the first and second coil sections are configured to be inherently decoupled or have minimal coupling. The coil system further comprises one or more fasteners removably and movably joining the housings of the first and second coil sections.

In a further aspect, the present invention provides a magnetic resonance imaging system comprising a main field magnet for generating a temporally constant magnetic field along a main field axis and an RF coil system. The RF coil system includes a first coil section configured for maximum or predominant field sensitivity along a first axis perpendicular to the main magnetic field axis, a second coil section configured for maximum sensitivity along a second axis perpendicular to the first and main magnetic field axes, and a fastening system for selectively fastening the first and second coil sections on opposite sides of a region of interest for quadrature reception of resonance signals emanating from the region of interest.

In yet a further aspect, the present invention provides a magnetic resonance method comprising the steps of establishing a polarizing magnetic field in a region of interest; exciting resonance of selected dipoles in the region of interest to generate magnetic resonance signals; and concurrently receiving the magnetic resonance on one side of the region of interest with a first linear coil having a maximum sensitivity along a first axis orthogonal to the polarizing magnetic field, and on an opposite side of the region of interest with a second linear coil having a maximum sensitivity along a second axis orthogonal to both the polarizing magnetic field and the first axis.

One advantage of the present invention is that it increases spatial openness around the subject.

Another advantage resides in its ability to easily select the desired coverage.

Another advantage resides in improved accommodation for stimulation devices, such as the type used for fMRI experiments, and coil placement or removal options to maximize patient comfort.

Another advantage resides in improved accommodation of patient comfort devices.

Another advantage of the present invention is that detaching coil sections still permit the remaining coil sections to be operational.

Another advantage of the present invention is that it accommodates life support or therapeutic devices such as ventilator tubing, tracheotomy tubes, immobilization collars, etc.

Another advantage of the present invention is that it provides detachable and/or relocatable coil sections matched to fMRI experiments, such as auditory or visual fMRI experiments. In addition to providing openness in the space around the subject's head that matches the requirements of the particular fMRI procedure, data acquisition throughput is increased in that the region of interest can be tailored to the appropriate region of the brain, i.e., the region or regions containing the neural activity of interest.

Another advantage of the present invention is that aliasing can be reduced by reduction of coverage of the excitation area.

Yet another advantage of the present invention is that coil concentration can be increased for areas of interest or extended to areas not well covered by the current coil designs.

Another advantage is that switching between different fMRI experiments and/or different stimulation equipment, such as between vision and auditory experiments, can be more readily performed.

Still another advantage resides in its ability to monitor relatively small signals, such as in blood oxygen level dependent contrast (BOLD) studies.

Yet another advantage of the present invention is that it allows a technologist to readily position and lock non-imaging devices.

Still another advantage of the present invention is that it is readily adaptable to time-saving techniques where temporal resolution is desired.

Still another advantage of the present invention is its adaptability to subjects having different body shapes and sizes, including subjects for whom the conventional head coil designs might provide an ill fit.

Yet another advantage of the present invention is that it is can also be used for interventional imaging.

Another advantage is that it allows addition, removal, and exchanging of coils.

Other advantages include the improved physiological monitoring, improved drug and contrast agent delivery, and improved delivery of gases such as anesthetizing gases or contrast-enhancing, e.g., hyperpolarized, gases.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENTS

Figure 1:
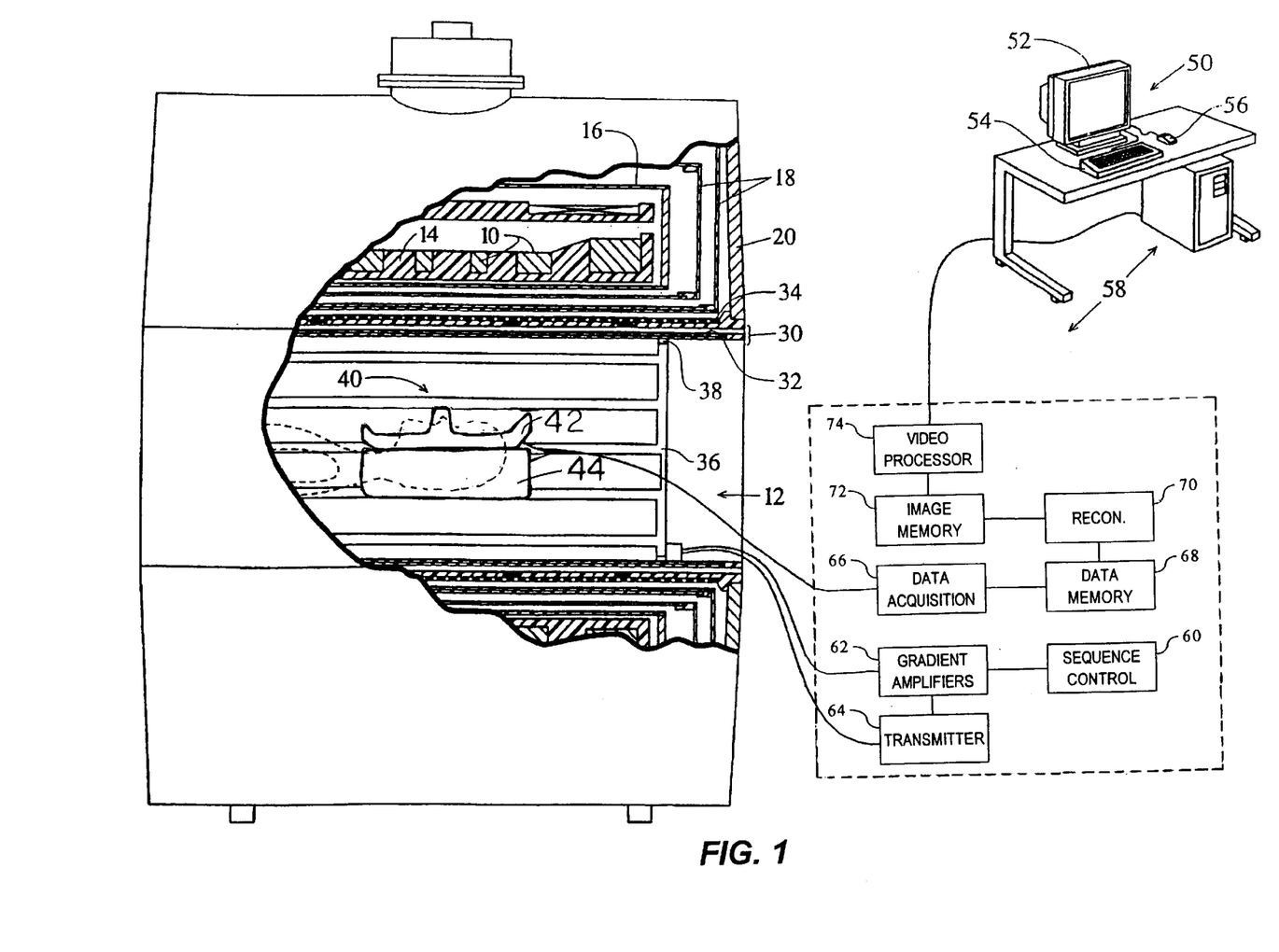
FIG. 1 is a diagrammatic illustration of a magnetic resonance imaging system apparatus including a coil construction in accordance with the present invention.

With reference to FIG. 1, a plurality of primary magnetic coils 10 generate a uniform, temporally constant magnetic field $B_0$ along a longitudinal or z-axis of a central bore 12. In a preferred superconducting embodiment, the primary magnet coils are supported by a former 14 and received in a toroidal helium vessel or can 16. The vessel is filled with helium to maintain the primary magnet coils at superconducting temperatures. The can 16 is surrounded by a series of cold shields 18 which are supported in a vacuum dewar 20. Of course, annular resistive magnets, open magnets, and the like are also contemplated.

A whole body gradient coil assembly 30 includes x-, y-, and z-gradient coils mounted along the bore 12 for generating gradient magnetic fields, $G_x$, $G_y$, and $G_z$ along the x, y, and z axes, respectively. Preferably, the gradient coil assembly is a self-shielded gradient coil that includes primary x, y, and z-coil assemblies 32 plotted in a dielectric former and secondary x, y, and z-coil assemblies 34 that are supported on a bore defining cylinder of the vacuum dewar 20. A whole body radio frequency coil 36 is mounted inside the gradient coil assembly 30. A whole body radio frequency shield 38, e.g., copper mesh, is mounted between the whole body RF coil 36 and the gradient coil assembly 30.

An insertable radio frequency head coil system 40 is removably inserted into the bore of an examination region defined about an isocenter of the magnet 10. In the illustrated embodiment, the insertable radio frequency coil system 40 comprises front or face coil section 42 and rear or back coil section 44. The front coil section 42 and the rear coil section 44 are shown aligned in opposing, facing relation defining a volume sized to receive a subject's head. The front coil is configured for maximum sensitivity to radio frequency signals along a first axis perpendicular to the main field or z-axis, e.g., the vertical axis. The rear coil is configured for maximum sensitivity to signals along an axis perpendicular to the first axis and the main field axis, e.g., the horizontal axis. In this manner, the front and rear coils are magnetically isolated and achieve quadrature detection.

An operator interface and control station 50 includes a human-readable display 52, such as a video, CRT, CCD, LCD, active matrix monitor, or the like, and one or more operator input devices including a keyboard 54, a mouse 56 or other pointing device, such as a trackball, track pad, joystick, light pen, touch-screen overlay, and the like. A computer control and reconstruction module 58 includes hardware and software for enabling the operator to select among a plurality of preprogrammed magnetic resonance sequences that are stored in a sequence control memory of a sequence controller 60. The sequence controller 60 controls gradient amplifiers 62 connected with the gradient coil assembly 30 for causing the generation of the $G_x$, $G_y$, and $G_z$ gradient magnetic fields at appropriate times during the selected gradient sequence. A digital transmitter 64 causes a selected one of the whole body and insertable radio frequency coils to generate $B_1$ radio frequency field pulses at times appropriate to the selected sequence.

In certain embodiments, the coil construction 40 is employed as both a transmitter and receiver coil. The use of coil construction 40 for transmission and receiving is particularly advantageous for imaging methods which employ pre-excitation or presaturation pulses prior to the imaging portion of the pulse sequence, such as flow tagging angiographic methods, fat saturation methods, and the like.

Resonance signals received by the coil construction 40 are demodulated by a data acquisition circuitry 66 and stored in a data memory 68. A reconstruction or array processor 70 performs a two- or three-dimensional inverse Fourier transform, or other known transform, to reconstruct a volumetric image representation that is stored in an image memory 72. A video processor 74 under operator control converts selected portions of the volumetric image representation into slice images, projection images, perspective views, or the like as is conventional in the art for display on the video monitor 52.

Figure 2:
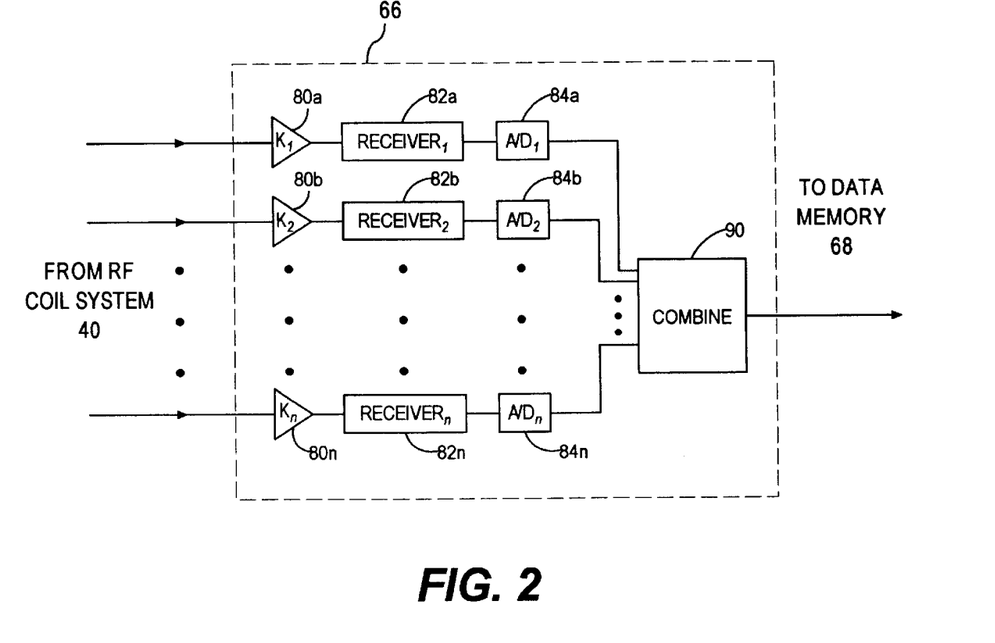
FIGS. 2 and 3 are functional block diagram illustrating alternative embodiments of data acquisition circuitry for use with the RF coil system in accordance with the present invention.

Referring now to FIG. 2, in a preferred embodiment of the data acquisition electronics 66, the signal from each of n individual RF coils in the head coil system 40 is amplified by a corresponding one of n individual preamplifiers 80a, 80b, ..., 80n, where n is the number of receiver coils in head coil system 40. The individual amplified signals are demodulated by n individual receivers 82a, 82b, ..., 82n and fed to an array of A/D converters including n individual A/D converters 84a, 84b, ..., 84n. A digital combiner 90 processes, weights, and combines the individual digital signals using standard digital signal processing techniques. The operator can also control the combiner 90 to divide the signals to be reconstructed to a plurality of related images. Alternatively, the signals from the coils can be digitized and then demodulated with digital receivers.

The number of receiving channels depends on the particular MRI system and thus, it will be recognized that it is not necessary that the number of receiver channels be equal to the number of RF coils. For example, the signals from a plurality of coils may be multiplexed or otherwise combined in analog or digital fashion with appropriate combining circuitry as necessary in light of the number of receiver channels available on the imaging system employed.

Figure 3:
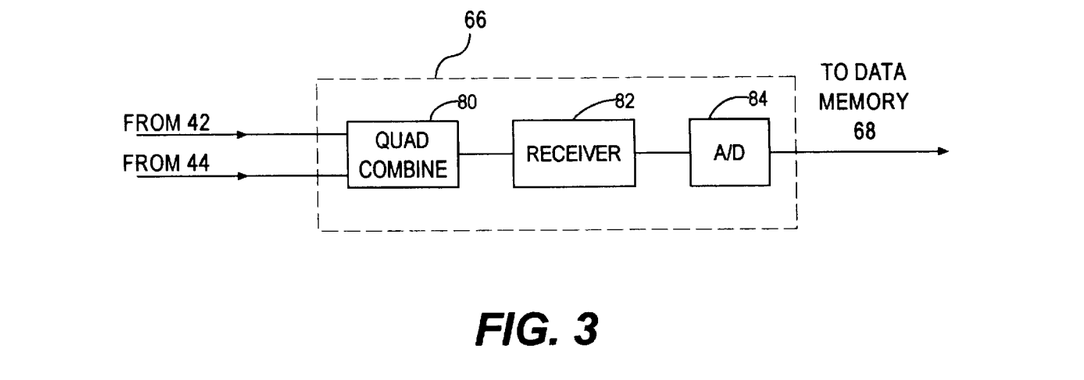

Referring now to FIG. 3, there appears a block diagram illustrating an alternative embodiment of data acquisition circuitry 66. The 90° out of phase analog signals received by the front and rear RF coils of head coil system 40 are combined by a conventional quadrature coil combiner 80, which typically phase shifts and adds the received signals. The resulting combined signal is supplied to a receiver 82. Receiver 82 demodulates the combined signal and an analog-to-digital converter 84 digitizes the signal to numerical data representative of the magnetic resonance signals. The data thus produced is stored in the data memory 68.

Figure 4:
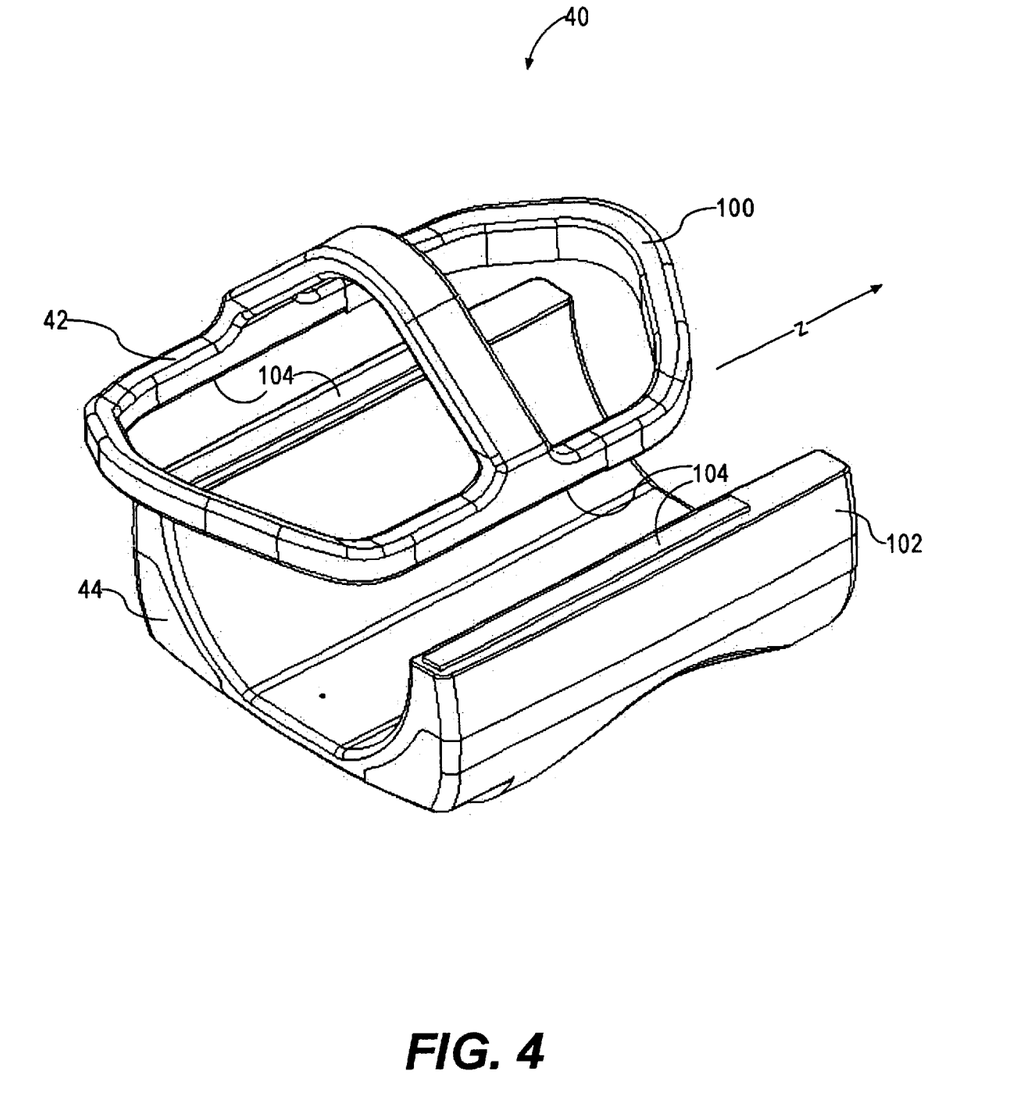
FIG. 4 illustrates a first exemplary embodiment of a coil construction according to the present invention.

Referring now to FIG. 4, there is shown a first exemplary embodiment of the head coil construction 40 according to the present invention. The front coil section 42 and the rear coil section 44 are constructed such that when arranged in facing relation, as depicted, they are inherently decoupled. As used herein, the terms "inherently decoupled" and "intrinsically isolated" describe coils or coil arrays that exhibit little or no mutual inductance. While complete decoupling is desirable, it will be recognized that complete decoupling is often a condition that cannot be met.

Therefore, the terms "inherently decoupled" and "intrinsically isolated" are not intended to preclude small amounts of coupling that are acceptable to the operation of the coils. In the preferred embodiment, the decoupling is achieved by designing the front and rear coils to be linearly polarized along orthogonal axes, although other decoupling techniques are also contemplated.

The inherent decoupling enables the front coil section 42 to be freely moved with respect to the rear coil section 44, or to be removed altogether, without the need to retune either coil system. Also, the front coil section 42 is exchangeable with alternate coil systems having field sensitivity in the same direction, for example, having different sizes, coil configurations, and so forth, without the need to retune the rear coil system 44.

Figure 6:
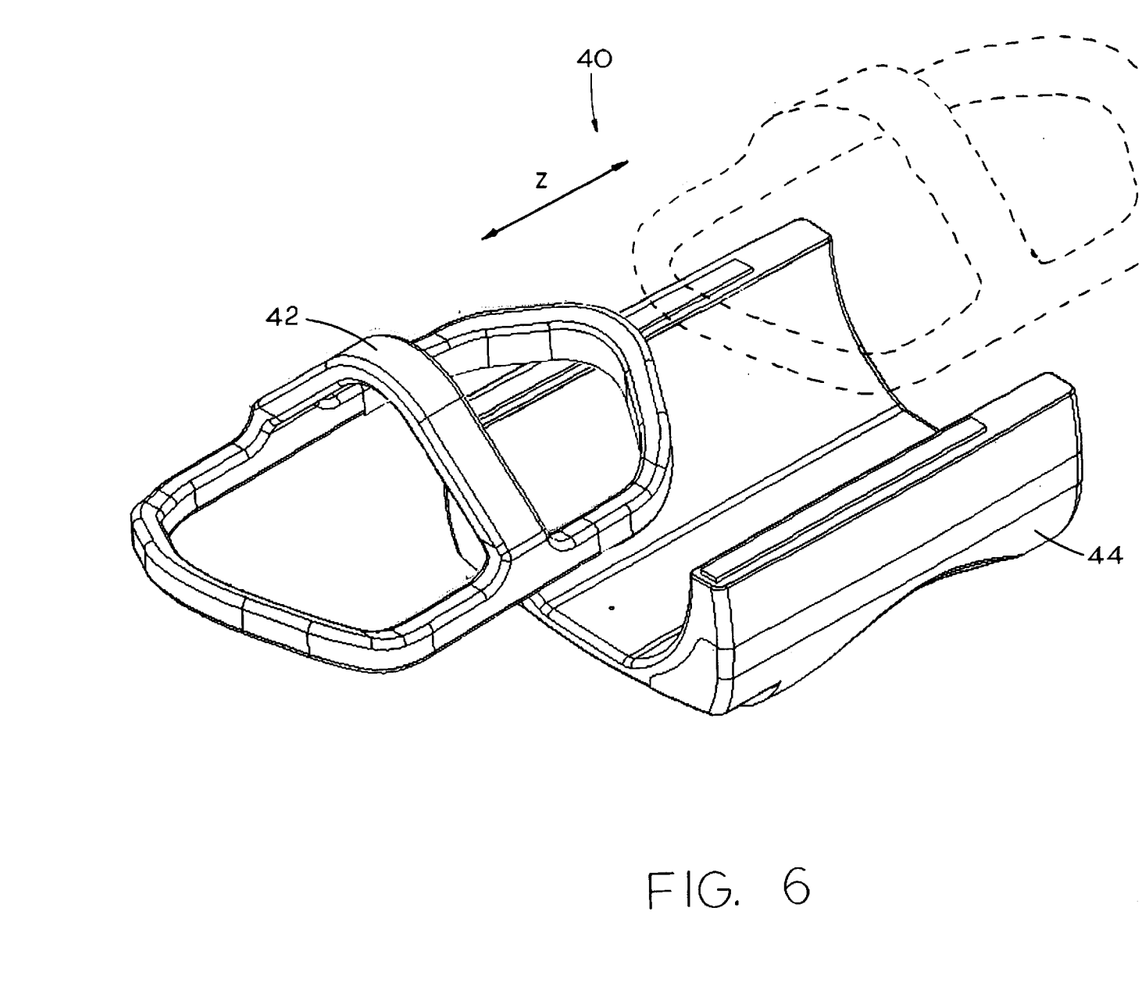
FIG. 6 illustrates a manner in which the movable coil section of FIG. 5 can be relocated.

The front coil section 42 of head coil construction 40 comprises a housing 100 constructed of a nonconductive material enclosing conductive RF coils and one or more fasteners or fastening systems 104. The fasteners 104 are depicted as elongate in the z-direction allowing front coil 42 to be removed and/or removably replaced at a plurality of, and preferably any number of, positions along the z-axis. The manner in which the front coil 42 can be freely positioned with respect to rear coil 44 is illustrated more clearly in FIG. 6. Fasteners 104 are preferably hook and loop fasteners, such as Velcro® or similar material. Other fastener types include, but are not limited to, removably attachable adhesive material, one or more clamps or latches, straps, snap fit fasteners, fasteners forming a sliding engagement between the coil halves, such as a guide pin, guide roller, guide rib, and so forth engaging a complimentary groove. A means for reproducing a given set up can optionally be provided, such as a scale or other markings or indicia on the housings 100 and 102. Where a sliding engagement between the coil halves is employed, they can optionally be positionable in a plurality of predetermined positions, for example, by providing one or more resilient or spring biased protrusions engaging a series of complimentary openings or depressions on the fastener 104 or housing halves 100 or 104. In still further embodiments, handles can be provided on the detachable/relocatable coil section housings to facilitate coil section movement, removal, and replacement.

Figure 5:
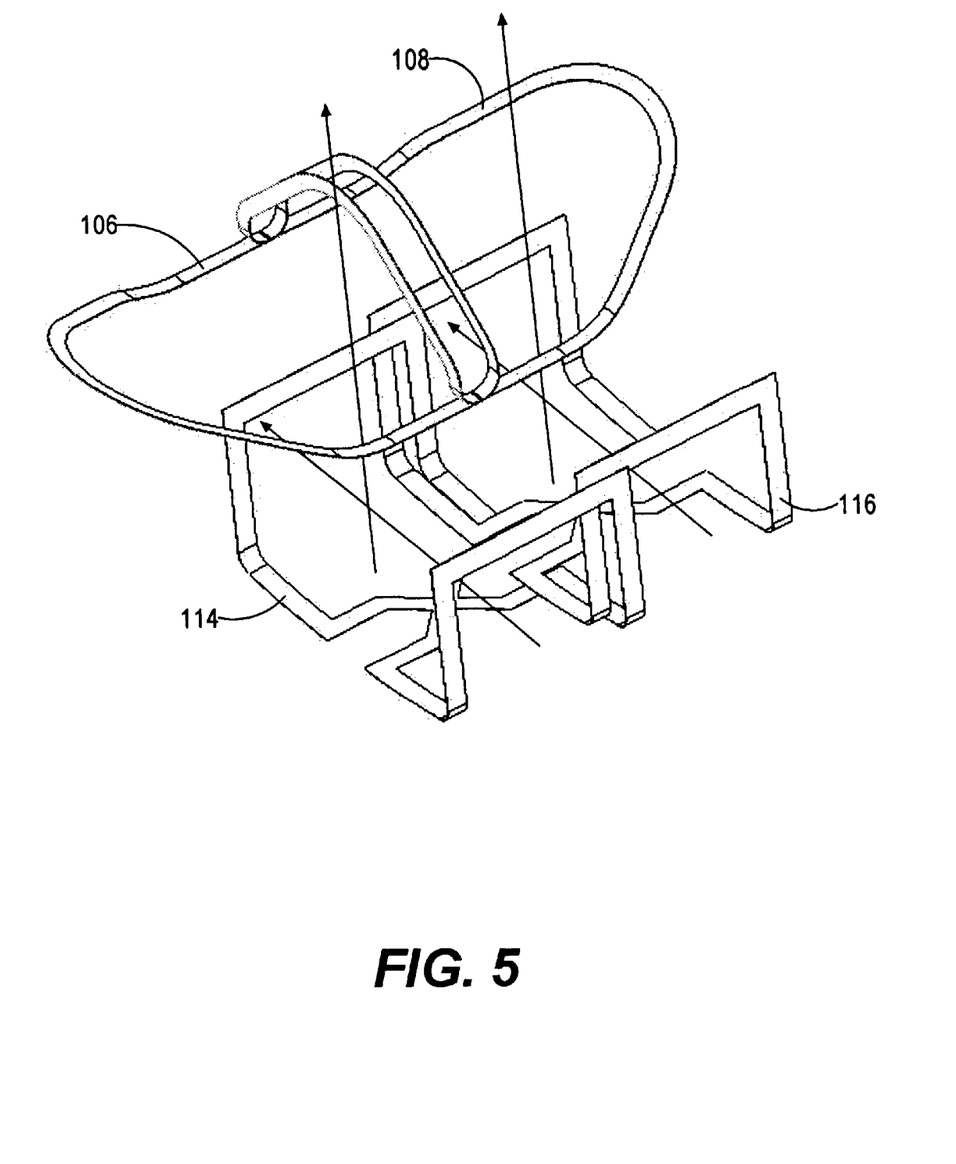
FIG. 5 shows the coil conductors of the embodiment of FIG. 4.

The coils of the head coil construction 40 are illustrated in FIG. 5. In the embodiment shown, the front coil section 42 comprises a pair of overlapping saddle or loop coils 106 and 108, which are overlapped and positioned for minimum mutual inductance to form a phased array. Other coils which have maximum sensitivity in the vertical direction are also contemplated. The rear coil section 44 comprises a pair of overlapping butterfly coils 114 and 116 arranged in a phased array. Other coils with maximum sensitivity in the horizontal direction, such as double-D coils, are also contemplated.

The coils are built with a conductive material, including but not limited to copper, aluminum, silver, or other conductive material. The coils can be built, for example, by laminating a nonconductive substrate with copper or other conductive foil, depositing a layer of copper or other metal onto a nonconductive substrate, and so forth. The coils can include conventional RF coil circuit components such as capacitors and so forth as appropriate to tune or match the coils as is known to those skilled in the art.

Figure 7:
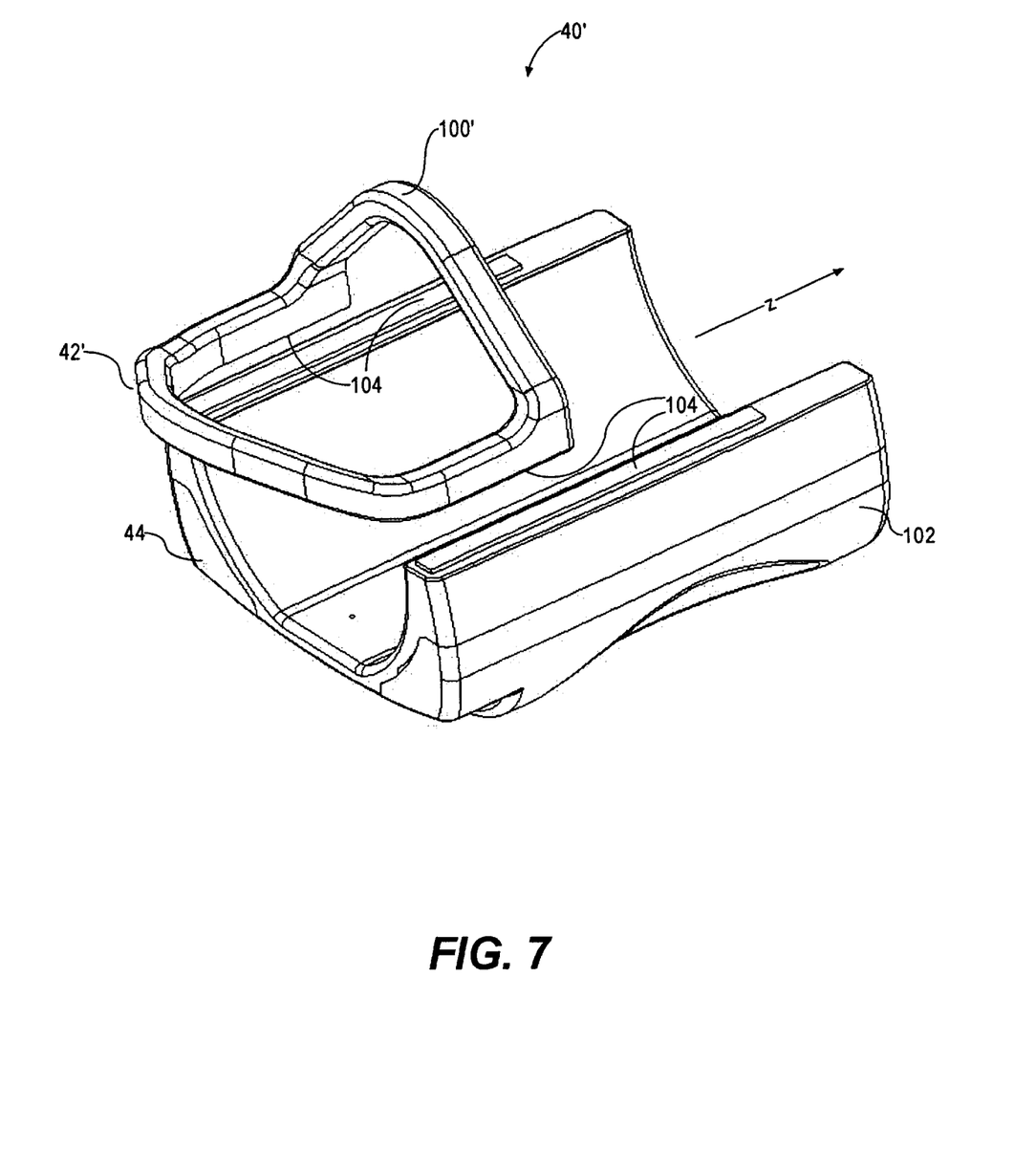
FIG. 7 illustrates a second exemplary embodiment of a coil construction according to the present invention.
Figure 8:
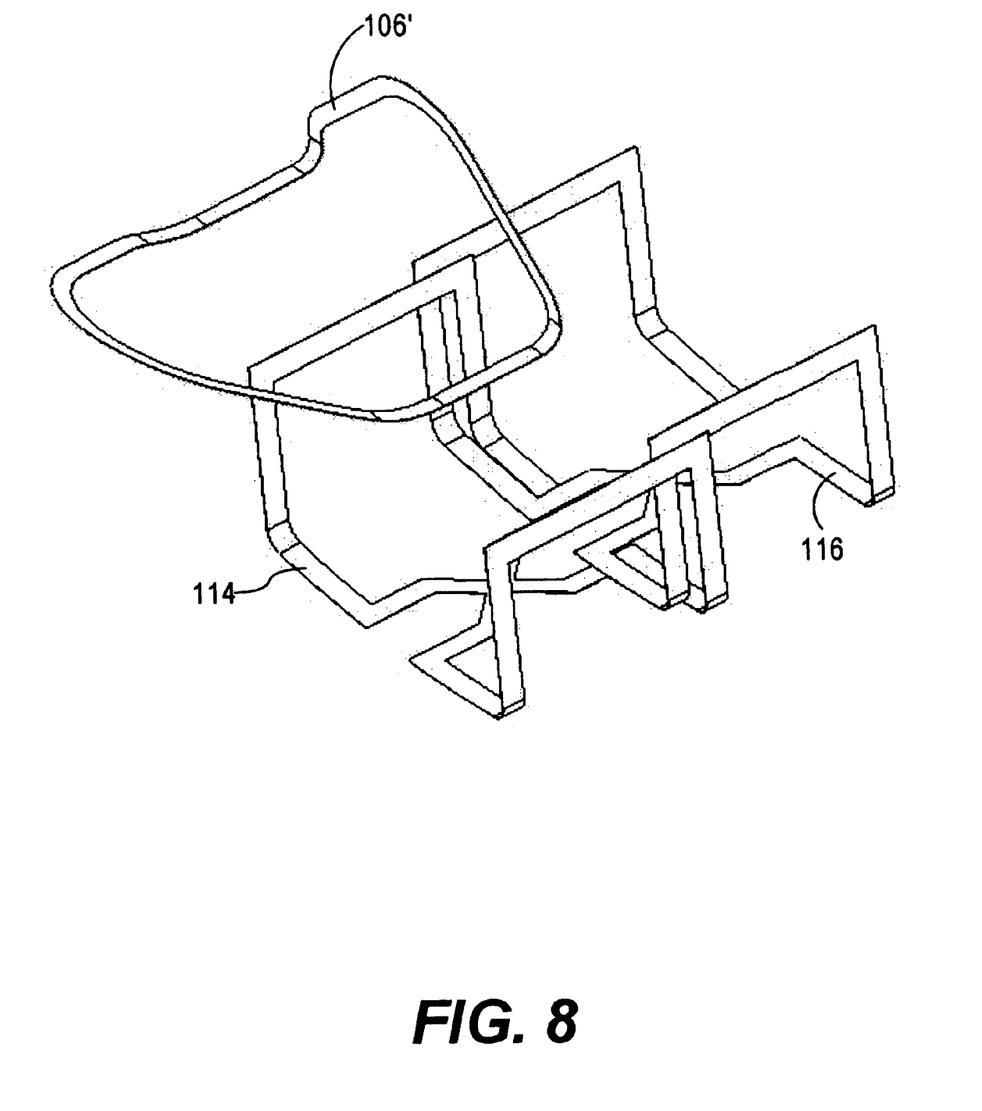
FIG. 8 shows the coil conductors of the embodiment of FIG. 7.

Referring now to FIGS. 7 and 8, there is shown a head coil construction 40' according to a second exemplary embodiment of the present invention. The head coil 40' comprises a front coil section 42' and a rear coil section 44 arranged in facing relation. Again, coil configurations which are inherently decoupled have been selected.

Figure 10:
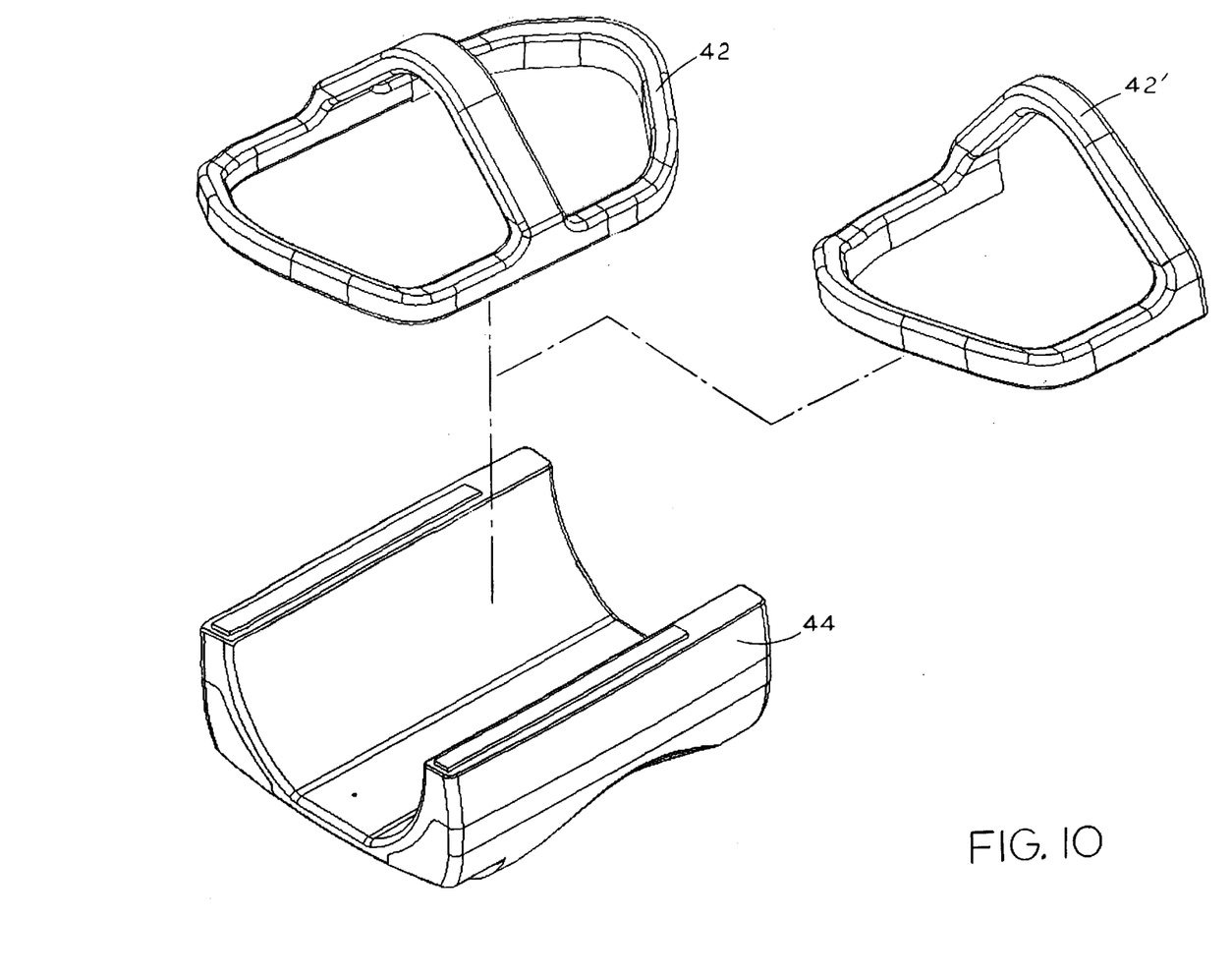
FIG. 10 illustrates a coil system in accordance with the present invention comprising multiple interchangeable coil sections.

The front coil section 42' in this embodiment is freely moveable and removable with respect to rear coil section 44 without the need to retune either coil system. Also, the front coil section 42' is exchangeable with alternate coil systems having field sensitivity in the same direction, for example, having different sizes, coil configurations, and so forth, without the need to retune the rear coil system 44. A head coil system that comprises a plurality of differently configured front coil sections 42 and 42', and the manner of their interchangeability, is illustrated in FIG. 10.

Figure 9:
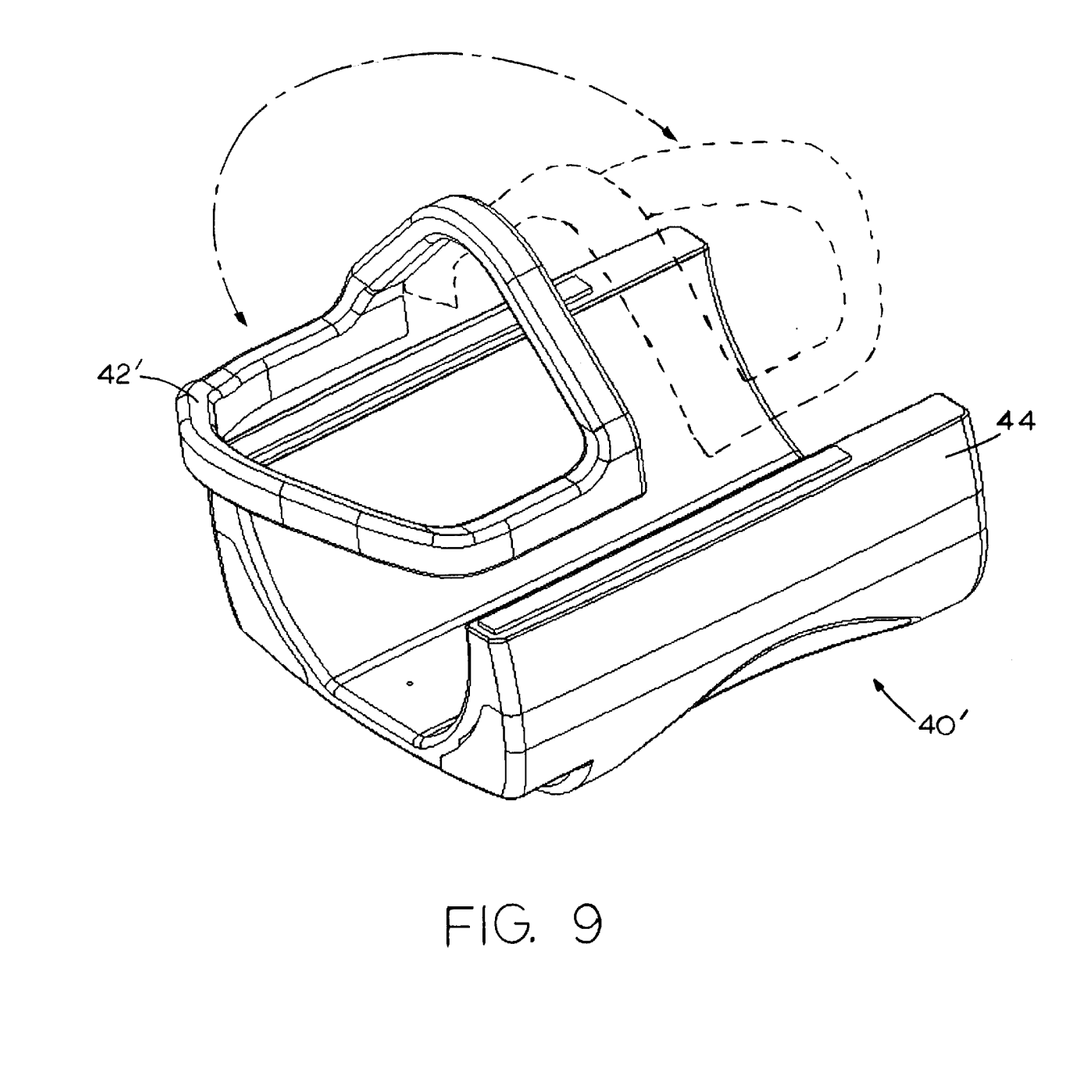
FIG. 9 illustrates an exemplary manner in which the movable coil section of FIG. 7 can be relocated.

Referring again to FIGS. 7 and 8, front coil section 42' of the head coil construction 40' comprises a housing 100' constructed of a nonconductive material enclosing a conductive RF coil 106' and one or more fasteners 104, as detailed above by way of reference to FIG. 4. Again, fasteners 104 allow removal of the front coil 42' and/or removable placement of front coil 42' in a plurality of positions along the z-direction in a manner analogous to that shown in FIG. 6. Likewise, coil system 42' can also be rotated, e.g., 180 degrees, as illustrated in FIG. 9. This facilitates placing the front coil close to the region of interest (ROI) to optimize sensitivity to signals from that region, but displaced from sources of artifacts such as moving eyes, metal dental work, and the like. Further, the fasteners can be used to attach other equipment in addition to or instead of the front coil section 42'.

The coils of the head coil construction 40', illustrated in the embodiment of FIG. 8, include a front coil section 42' comprising a single loop saddle coil 106' and the rear coil section 44', comprising a pair of overlapping butterfly coils 114 and 116 arranged in a phased array. The coils are built with a conductive material and can include additional circuit components as described above by way of reference to FIG. 5.

The use of horizontal field coils in the rear coil is particularly advantageous when imaging the base of the brain, which is in close proximity to the rear coil. When other areas are of primary interest, the front coil can be the horizontal field coil and the rear coil can be the vertical field coil.

In preferred embodiments, in addition to being physically displaceable, removable, and/or interchangeable, it is particularly advantageous that the front and rear coil systems of the present invention are electronically individually and selectively removable from the circuit. Likewise, it is particularly advantageous, when either or both of front and rear coil sections are multi-coil systems, that individual coils thereof be electronically individually and selectively removable or replaceable.

Figure 11:
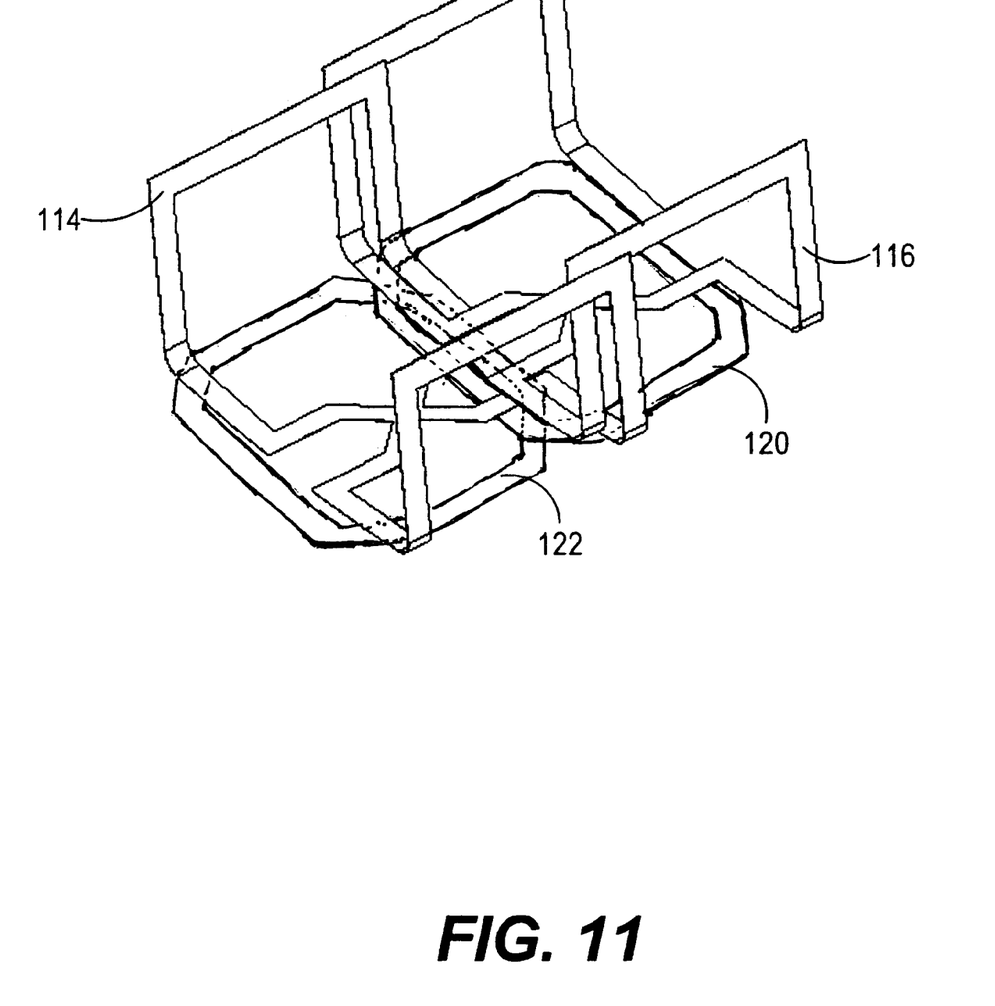
FIG. 11 illustrates an alternative embodiment of a coil section of the present invention.

In certain embodiments, the rear coil 44 includes a coil or a phased array of coils having a maximum sensitivity in a horizontal direction and a coil or phased array of coils having a maximum or predominant sensitivity in the vertical direction. An exemplary embodiment of such a rear coil arrangement is illustrated in FIG. 11, which includes overlapping butterfly coils 114 and 116, and which further includes overlapping loop coils 120 and 122. In operation, when a front coil (e.g., 42, 42')is present, the loop coils 120 and 122 are electronically removed from the circuit. However, when the front coil is removed in accordance with this teaching, coils 120 and 122 can be engaged and the rear coil alone can be used alone to provide quadrature detection. This configuration is advantageous for imaging the cervical spine and the back of the head, and for fMRI applications requiring access to the subject's face. The use of the rear coil section illustrated in FIG. 11 alone in a non-quadrature mode is also contemplated, e.g., wherein a front coil section is removed and wherein coils 120 and 122 are electronically removed.

In operation, the RF coil construction in accordance with this teaching allows the MRI operator to perform anatomical imaging of the entire head followed by facile change in coil configuration, e.g., coil or coil set removal (either physical or electronic), adjustment of the front coil or coil set placement, exchange of coil sections for stimulation devices, comfort devices, or alternate coil sets. Calibration, landmark adjustment of the coil, and repeatable position of stimulation devices can also be improved through positioning.

In certain embodiments, the entire coil system of the present invention is used for anatomical imaging of the entire head or the head and neck of the subject. The ability to slide or relocate the coil sections improve the adaptability in the coverage, accommodating a wide range of patient profiles, such as patient size, length of neck, kyphotic subjects, and other body types.

The coil system in accordance with this teaching can also be used with any other coils or coils sets with which it is decoupled. For example, a head coil system in accordance with this teaching can be operated with a spinal imaging array for imaging the central nervous system. Other coils that can be used with the coil system of the present invention include thyroid coils, cardiac coils, or other local coils, such as a coil for imaging trauma sites, and so forth.

Functional images may require only a portion of the region of interest to be acquired. Thus, during fMRI studies, one or more coils are moved or removed (either physically or electronically) to more closely tailor the imaging field of view (FOV) to match the region of interest during fMRI (e.g., the region appropriate to the brain response sought to be observed). This improves imaging throughput and accuracy while also improving access for placement of stimulation devices for use in fMRI experiments. In especially preferred embodiments, stimulation devices or patient comfort devices are connected, e.g., using fasteners 104, or otherwise, or placed into positions vacated by the detached coil sections. Comfort devices are helpful in achieving patient cooperation, e.g., in the patient cooperating to remaining still. Comfort devices which may be employed with the present invention include, for example, audio and/or visual devices for the presentation of music, movies, television, and so forth. Advantageously, the comfort devices are exchangeable with removable coil section, for example, occupying a space vacated by the removal of a coil section. Coil sections integrating such comfort devices are also contemplated.

In certain embodiments, a visual stimulation fMRI experiment is performed using the coil system in accordance with the present invention. The front coil section is moved to a position that does not obstruct the subject's field of vision (and optionally electronically removed) or physically removed. In a preferred aspect, the imaged region comprises the occipital lobe and cerebellum regions of the subject, and the imaged region does not include the subject's eye region.

The coil construction of the present invention can also be modified to integrate stimulation devices, e.g., on or within the coil housing. For example, a combined stimulation device/RF coil section can include, for example, an auditory stimulation device such as audio speakers (e.g., in a headphone-like configuration within the coil section), optical displays, and the like.

It will be recognized that the present invention is not limited to the above-described embodiments and that the invention is also applicable to other coil types. For example, the front coil loops are not limited to the configurations shown, and can comprise planar and non-planar loops (circular, square, rectangular, elliptical) and phased arrays thereof, Helmholtz coils, and the like. Likewise, the rear coil section can comprise a single butterfly coil or a phased array of more than two butterfly coils, ladder coils, double-D coils, and the like. For optimal signal-to-noise ratio, the front and rear coil systems have a quadrature relationship.

Likewise, although the invention has been shown and described herein primarily by way of reference to a moveable, detachable, and/or interchangeable front coil section that is particularly suited for fMRI experiments requiring access to the facial region, other arrangements are contemplated as well. For example, the present invention can be readily adapted so as to provide access to the subject's ears, for example, through the use of removable coils or through the use of a coil configuration and housing having openings or cutaway regions allowing access to the ears.

The description above should not be construed as limiting the scope of the invention, but as merely providing illustrations of some of the presently preferred embodiments of this invention. In light of the above description and examples, various other modifications and variations will now become apparent to those skilled in the art without departing from the spirit and scope of the present invention as defined by the appended claims. Accordingly, the scope of the invention should be determined solely by the appended claims and their legal equivalents.

Having thus described the preferred embodiments, the invention is now claimed to be:

1. An RF coil system for magnetic resonance imaging one or more regions of a subject, comprising:
   a first coil section comprising one or more conductive coils in a first nonconductive housing;
   a second coil section comprising one or more conductive coils in a second nonconductive housing, the first and second coil sections being configured to be inherently decoupled; and
   a mechanical fastener system which removably selectively fastens the first coil section at any one of a plurality of longitudinally displaced locations along the second coil section.

2. The RF coil system of claim 1, wherein the first and second coil sections are fastened together in facing relation to define a volume therebetween, the volume for receiving at least a portion of the subject.

3. The RF coil system of claim 1, wherein the first and second coil sections are fastened together in facing relation to define a volume therebetween, the volume for receiving at least a portion of the subject's head, neck, or both.

4. The RF coil system of claim 3, wherein the first and second coil sections are configured to allow access to the subject.

5. The RF coil system of claim 1, wherein the second coil section comprises a phased array of two or more coils.

6. An RF coil system for magnetic resonance imaging one or more regions of a subject, comprising:
   a first coil section comprising one or more conductive coils in a first nonconductive housing;
   a second coil section comprising one or more conductive coils in a second nonconductive housing, the first and second coil sections being configured to be inherently decoupled; and
   a fastener system removably and slidingly engaging the housings of the first and second coil sections, sliding engagement between the first and second coil sections enabling the housing to be attached over a range of slidingly offset relationships.

7. The RF coil system of claim 6, wherein the first and second coil sections are configured to allow access to the subject.

8. The RF coil system of claim 6, wherein the second coil section comprises a multi-coil system.

9. The RF coil system of claim 8, further comprising circuitry for selectively electronically disabling one or more coils of the multi-coil system.

10. The RF coil system of claim 8, wherein the first coil section comprises a phased array of two or more loop coils.

11. The RF coil system of claim 8, wherein the first coil section comprises a single loop coil.

12. The RF coil system of claim 6, wherein:
the first coil section includes a linear coil with a maximum sensitivity along a first axis; and
the second coil section includes a linear coil with a maximum sensitivity along a second axis orthogonal to the first axis.

13. The RF coil system of claim 12, wherein the first axis is vertical and the second axis is horizontal.

14. The RF coil system of claim 6, further wherein:
the second coil section includes a first linear coil with a maximum sensitivity along a first axis and a second linear coil with a maximum sensitivity along a second axis orthogonal to the first axis; and
one or both of the first and second linear coils can selectively be disengaged.

15. An RF coil system for magnetic resonance imaging one or more regions of a subject, comprising:
a first coil section comprising one or more conductive coils in a first nonconductive housing;
a second coil section comprising one or more conductive coils in a second nonconductive housing, the first and second coil sections being configured to be inherently decoupled; and
a fastener system including strips of a hook and loop fastener extending along opposite edges of the housings for removably and movably joining the housings of the first and second coil sections over a range of longitudinally and rotationally offset orientations.

16. An RF coil system for magnetic resonance imaging one or more regions of a subject, comprising:
a first coil section comprising one or more conductive coils in a first nonconductive housing;
a second coil section comprising one or more conductive coils in a second nonconductive housing, the first and second coil sections being configured to be inherently decoupled, the second coil section being operable to image a region of the subject in the absence of the first coil section without retuning the second coil section; and
a fastener system removably and movably joining the housings of the first and second coil sections.

17. The RF coil system of claim 16, wherein the region of the subject includes at least one region selected from the subject's brain stem, occipital lobe, and cerebellum.

18. An RF coil system for magnetic resonance imaging one or more regions of a subject, comprising:
a plurality of interchangeable first coil sections including sections with single and multi-coil element coils each in a nonconductive housing;
a second coil section comprising one or more conductive coils in a second nonconductive housing, the second coil section being configured to be inherently decoupled to each of the plurality of first coil sections; and
a fastener system removably and movably joining the housings of the first and second coil sections.

19. A magnetic resonance imaging system comprising:
a main field magnet for generating a temporally constant polarizing magnetic field along a main field axis; and
an RF coil system including:
a first linear coil section configured for maximum sensitivity along a first axis perpendicular to the main magnetic field axis;
a second linear coil section configured for maximum sensitivity along a second axis perpendicular to both the first axis and the main magnetic field axis; and
a fastening system for selectively fastening the first and second coil sections on opposite sides of a region of interest for quadrature reception of resonance signals emanating from the region of interest.

20. The magnetic resonance imaging system of claim 19, wherein at least one of the first, second, and third coil sections is a phased array.

21. The magnetic resonance imaging system of claim 19, wherein the RF coil system is electronically coupled to an RF transmitter.

22. A magnetic resonance imaging system comprising:
a main field magnet for generating a temporally constant magnetic field along a main field axis; and
an RF coil system including:
a first coil section configured for maximum sensitivity along a first axis perpendicular to the main magnetic field axis;
a second coil section configured for maximum sensitivity along a second axis perpendicular to the first and main magnetic field axes;
a third coil section of a different configuration from the first coil section;
a fastening system selectively fastening the first and third coil sections to the second coil section on opposite sides of a region of interest for quadrature reception of resonance signals emanating from the region of interest.

23. The magnetic resonance imaging system of claim 22, wherein:
the second coil section includes a multi-coil array;
the first coil section includes a single loop; and
the third coil section includes a phased array.

24. The magnetic resonance imaging system of claim 21, further including a patient comfort device interchangeable with at least one of the first and third coil section.

25. A magnetic resonance method comprising:
establishing a polarizing magnetic field in a first region of interest;
exciting resonance of selected dipoles in the first region of interest to generate magnetic resonance signals; and
concurrently receiving the magnetic resonance on one side of the first region of interest with a first linear coil having a maximum sensitivity along a first axis orthogonal to the polarizing magnetic field and on an opposite side of the first region of interest with a second linear coil having a maximum sensitivity along a second axis orthogonal to both the polarizing magnetic field and the first axis.

26. The method of claim 25, wherein the first and second coils are inherently decoupled, and further including:

shifting the first coil relative to the second coil; and without retuning the first or second coils, repeating the exciting and receiving steps.

27. The method of claim 25, further including:

removing the first coil; and without retuning the second coil, repeating the exciting and receiving steps.

28. The method of claim 27, further including replacing the first coil with a stimulation device.

29. The method of claim 27, further including replacing the first coil with a patient comfort device.

30. The method of claim 25, further including:

removing the first coil;

replacing the first coil with a third coil that is intrinsically isolated from the second coil; and without retuning the second coil, repeating the exciting and receiving steps.

31. The method of claim 25, further including:

removing the first coil;

replacing the first coil with one or both of a third coil that is intrinsically isolated from the second coil and a patient comfort device; and without retuning the second coil, repeating the exciting and receiving steps.

32. The method of claim 25, wherein the first region of interest is at least a portion of a subject's brain, and further including:

stimulating a neural function of the subject producing a response within the first region of interest during at least one of the exciting and receiving steps.

33. The method of claim 25, wherein the first region of interest includes at least one region selected from the subject's brain stem, occipital lobe, and cerebellum, and further including:

stimulating a sensory system of the subject during at least one of the exciting and receiving steps.

34. The method of claim 33, and further wherein the imaged region of interest does not include the subject's eyes and wherein access to an area around the subject's eyes is achieved through removal or displacement of coils around the subject's eyes.

35. The method of claim 25, further including:

establishing a polarizing magnetic field in a second region of interest;

exciting resonance of selected dipoles in the second region of interest to generate magnetic resonance signals;

concurrently receiving the magnetic resonance signals from the second region of interest with a third coil.

* * * * *